(12) United States Patent
Chen et al.

(10) Patent No.: US 10,927,848 B2
(45) Date of Patent: Feb. 23, 2021

(54) FAN MODULE AND ELECTRONIC DEVICE

(71) Applicant: ASUSTeK COMPUTER INC., Taipei (TW)

(72) Inventors: Chi-Chuan Chen, Taipei (TW); Ming-Hsiu Wu, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 45 days.

(21) Appl. No.: 16/356,053

(22) Filed: Mar. 18, 2019

(65) Prior Publication Data

US 2019/0301485 A1 Oct. 3, 2019

(30) Foreign Application Priority Data

Mar. 28, 2018 (TW) .................. 107110791

(51) Int. Cl.
| | |
|---|---|
| *F04D 29/42* | (2006.01) |
| *F04D 25/08* | (2006.01) |
| *G06F 1/20* | (2006.01) |
| *H05K 7/20* | (2006.01) |
| *F04D 29/44* | (2006.01) |
| *F04D 17/16* | (2006.01) |

(52) U.S. Cl.
CPC ......... *F04D 29/4226* (2013.01); *F04D 17/16* (2013.01); *F04D 25/08* (2013.01); *F04D 29/441* (2013.01); *G06F 1/203* (2013.01); *H05K 7/20145* (2013.01)

(58) Field of Classification Search
CPC .. F04D 29/4206; F04D 29/424; F04D 29/441; H05K 7/20172; H05K 7/20145
See application file for complete search history.

(56) References Cited

U.S. PATENT DOCUMENTS

| | | | | |
|---|---|---|---|---|
| 6,585,485 | B2* | 7/2003 | Lee .................... | F04D 29/4213 415/176 |
| 7,549,842 | B2* | 6/2009 | Hanson ............. | B60H 1/00471 415/204 |
| 7,825,552 | B2* | 11/2010 | Husband .................. | H02K 1/20 310/216.081 |
| 8,508,939 | B2* | 8/2013 | Takahasi ................ | F04D 25/08 361/679.49 |
| 8,888,450 | B2* | 11/2014 | Degner ............... | F04D 25/0613 415/206 |
| D721,338 | S  * | 1/2015 | Andre ......................... | D13/179 |
| 9,200,637 | B2* | 12/2015 | Aiello ................... | F04D 29/281 |
| 9,334,867 | B2* | 5/2016 | Aiello ..................... | F04D 17/16 |
| 9,720,466 | B2* | 8/2017 | Ting ........................ | G06F 1/203 |
| 9,846,462 | B2* | 12/2017 | Chen ....................... | G06F 1/203 |
| 10,285,303 | B2* | 5/2019 | Williams ................ | G06F 1/203 |

(Continued)

FOREIGN PATENT DOCUMENTS

CN 103835965 B 8/2016

*Primary Examiner* — Eldon T Brockman
*Assistant Examiner* — Topaz L. Elliott
(74) *Attorney, Agent, or Firm* — McClure, Qualey & Rodack, LLP

(57) ABSTRACT

A fan module is provided. The fan module includes a housing and an impeller. The housing includes a cover plate. The impeller is disposed in the housing and configured to rotate around an axis. The cover plate has an outer outline away from the axis. A tangent line of an endpoint on the outer outline intersects with the axis to form an angle, and the angle is not a right angle.

13 Claims, 7 Drawing Sheets

(56) References Cited

U.S. PATENT DOCUMENTS

| | | | | |
|---|---|---|---|---|
| 10,375,853 B2* | 8/2019 | Aiello | ................ | H01L 23/4006 |
| 10,436,217 B2* | 10/2019 | Aiello | .................... | F04D 29/30 |
| 2011/0056659 A1* | 3/2011 | Horng | ................... | H01L 23/467 |
| | | | | 165/104.26 |
| 2012/0247739 A1* | 10/2012 | Fujiwara | ............... | F04D 25/062 |
| | | | | 165/121 |
| 2013/0286292 A1* | 10/2013 | Yamaguchi | .............. | H04N 5/44 |
| | | | | 348/725 |
| 2015/0192145 A1* | 7/2015 | Koo | ........................ | G06F 1/203 |
| | | | | 415/208.1 |
| 2015/0260198 A1* | 9/2015 | Aiello | .................. | F04D 29/441 |
| | | | | 415/206 |
| 2015/0275901 A1* | 10/2015 | Yang | ...................... | F04D 17/16 |
| | | | | 361/679.08 |
| 2016/0013696 A1* | 1/2016 | Aiello | .................... | F04D 17/08 |
| | | | | 310/71 |
| 2016/0369819 A1* | 12/2016 | Lofy | ................... | F04D 29/4246 |
| 2017/0153676 A1* | 6/2017 | Ting | ........................ | G06F 1/203 |

* cited by examiner

FAN MODULE AND ELECTRONIC DEVICE

CROSS-REFERENCE TO RELATED APPLICATION

This application claims the priority benefit of Taiwan application serial No. 107110791, filed on Mar. 28, 2018. The entirety of the above-mentioned patent application is hereby incorporated by reference herein and made a part of the specification.

BACKGROUND OF THE INVENTION

Field of the Invention

This disclosure relates to a fan module and an electronic device including the fan module.

Description of the Related Art

With the progress of technologies, the performance of electronic computers has prominently developed. In recent years, the performance requirements of a notebook computer have become as high as that of a desktop computer. To make notebook computers more convenient to carry, the volume and thickness of notebook computers are designed for smaller dimension.

However, not like desktop computers, a notebook computer is limited by the small volume which lacks with enough space for heat dissipation modules or cooling fans for enhancing heat dissipation. In addition, due to the limitations by the thin dimension, an air channel formed between fan module and the housing of the notebook computer also becomes smaller, and the fluid impedance of an airflow entering a fan through the air channel dramatically increases. The foregoing problem leads to slow heat dissipation. Consequently, the notebook computer is operated in a high-temperature environment for a long time. As a result, the computer easily crashes, and service lives of the component inside the computers are shortened.

BRIEF SUMMARY OF THE INVENTION

According to a first aspect of the disclosure, a fan module is provided. The fan module includes a housing and an impeller. The housing includes a cover plate. The impeller is disposed in the housing and configured to rotate around an axis. The cover plate has an outer outline away from the axis. A tangent line of an endpoint on the outer outline intersects with the axis to form an angle, and the angle is not a right angle.

According to a second aspect of the disclosure, an electronic device is provided. The electronic device includes a system upper cover, a system lower cover, and a fan module. The fan module is disposed between the system upper cover and the system lower cover and includes a housing and an impeller. The housing includes a cover plate. The impeller is disposed in the housing and configured to rotate around an axis. The cover plate has an outer outline away from the axis. A tangent line of an endpoint on the outer outline intersects with the axis to form an angle, and the angle is not a right angle.

BRIEF DESCRIPTION OF THE DRAWINGS

To make the foregoing and other objectives, features, advantages, and embodiments of this disclosure more obvious and easily understood, descriptions of the accompanying drawings are as follows.

DETAILED DESCRIPTION OF THE EMBODIMENTS

A plurality of embodiments of this disclosure is disclosed below by using figures. For clear description, many practical details are described together in the following statement. However, it should be learnt that these practical details should not be intended to limit this disclosure. That is, in some embodiments of this disclosure, these practical details are unnecessary. In addition, to simplify the figures, some conventional common structures and elements are illustrated in a simple schematic manner in the figures.

Figure 1:
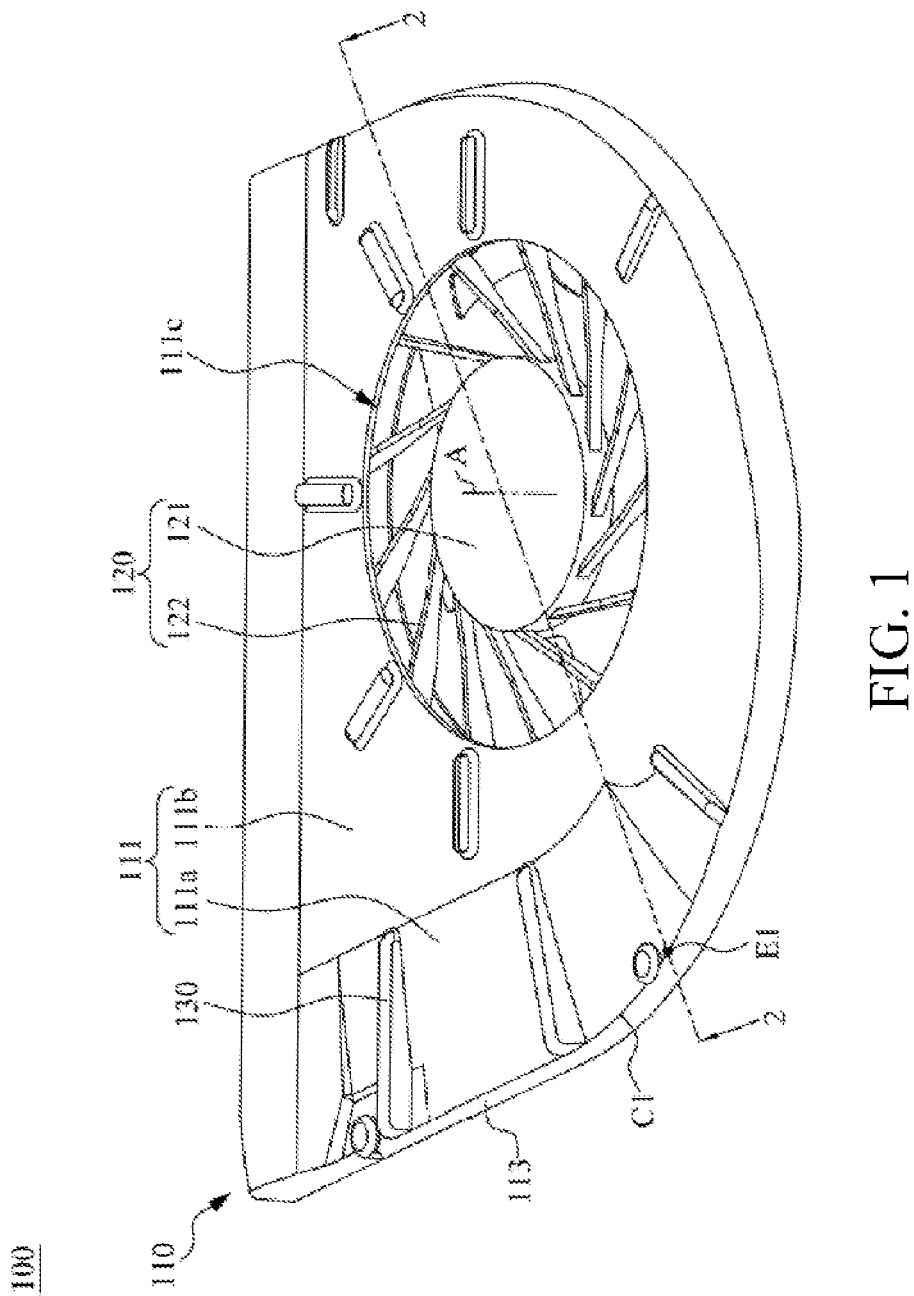
FIG. 1 is a three-dimensional diagram of a fan module according to an embodiment of this disclosure.
Figure 2:
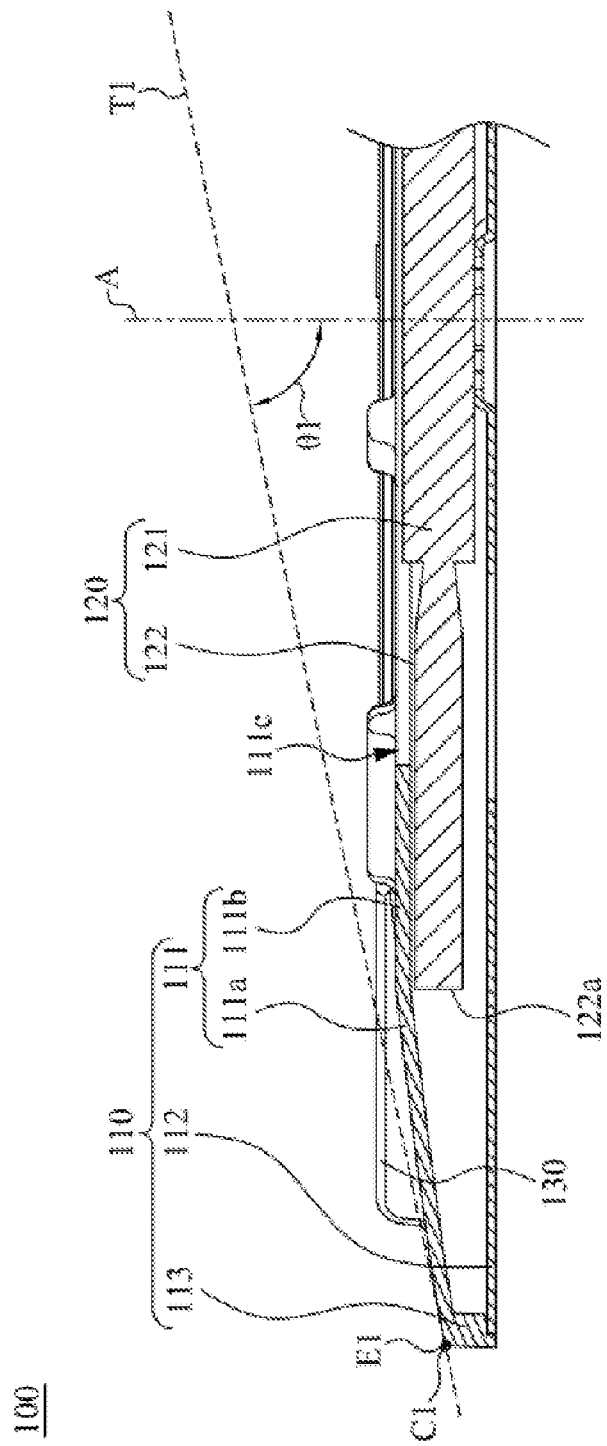
FIG. 2 is a cross-sectional view of the fan module in FIG. 1 along a line segment 2-2.

Refer to FIG. 1 and FIG. 2. FIG. 1 is a three-dimensional diagram of a fan module 100 according to an embodiment of this disclosure. FIG. 2 is a cross-sectional view of the fan module 100 in FIG. 1 along a line segment 2-2. The following describes in detail structures and functions of elements included in the fan module 100 and connection and actuation relationships between the elements.

As shown in FIG. 1 and FIG. 2, in this embodiment, the fan module 100 is a centrifugal fan. The fan module 100 includes a housing 110 and an impeller 120. The housing 110 includes a first cover plate 111, a second cover plate 112, and a side plate 113. The first cover plate 111 and the second cover plate 112 are respectively located on two opposite sides of the impeller 120, and the side plate 113 is surrounded and connected with outer edges of the first cover plate 111 and the second cover plate 112. The first cover plate 111, the second cover plate 112, and the side plate 113 together form internal space of the housing 110. The impeller 120 is disposed in the internal space of the housing 110 and is configured to rotate around an axis A relative to the housing 110.

Further, the impeller 120 includes a hub 121 and a plurality of blades 122. The hub 121 is rotatably disposed on the second cover plate 112 and the hub 121 is configured to rotate around the axis A. The blades 122 are annularly arranged and connected to an outer edge of the hub 121. The first cover plate 111 has an air inlet 111c at a position corresponding to the hub 121. When the impeller 120 rotates around the axis A, the blade 122 has a traction action on air, so as to generate an airflow that enters the housing 110 through the air inlet 111c.

As shown in FIG. 1 and FIG. 2, in this embodiment, the first cover plate 111 has a first outer outline C1 away from the axis A. A tangent line T1 of an endpoint E1 on the first outer outline C1 intersects with the axis A to form an angle θ1, and the angle θ1 is not a right angle. Based on the structural configuration, the fan module 100 in this embodiment effectively reduces the fluid impedance generated because the airflow located near the side plate 113 moves to an upper surface of the first cover plate 111. Therefore, the flow rate of an airflow generated by the fan module 100 in this embodiment is effectively increased at a side of the housing 110.

As shown in FIG. 1 and FIG. 2, in this embodiment, the first cover plate 111 has a first oblique portion 111a and a first plane portion 111b. The first oblique portion 111a obliquely extends to the first outer outline C1 relative to the axis A. The first plane portion 111b is located at an end of the first oblique portion 111a that close to the axis A.

As shown in FIG. 2, in this embodiment, the first oblique portion 111a includes a curved area, and the curved area is bent toward a direction away from the impeller 120. In other embodiments, the first oblique portion 111a includes a planar area.

As shown in FIG. 2, in this embodiment, the first plane portion 111b substantially extends along a direction perpendicular to the axis A.

As shown in FIG. 2, in this embodiment, the first oblique portion 111a is connected to the first plane portion 111b. In other embodiments, the first cover plate 111 further has at least one relay portion connected between the first oblique portion 111a and the first plane portion 111b.

As shown in FIG. 2, in this embodiment, the side plate 113 is connected to an end of the first oblique portion 111a away from the axis A and is connected to the first outer outline C1. In some embodiments, a chamfer formed at a part of the side plate 113 is connected to the first oblique portion 111a, and the chamfer is smoothly connected to the endpoint E1 of the first outer outline C1.

Figure 3:
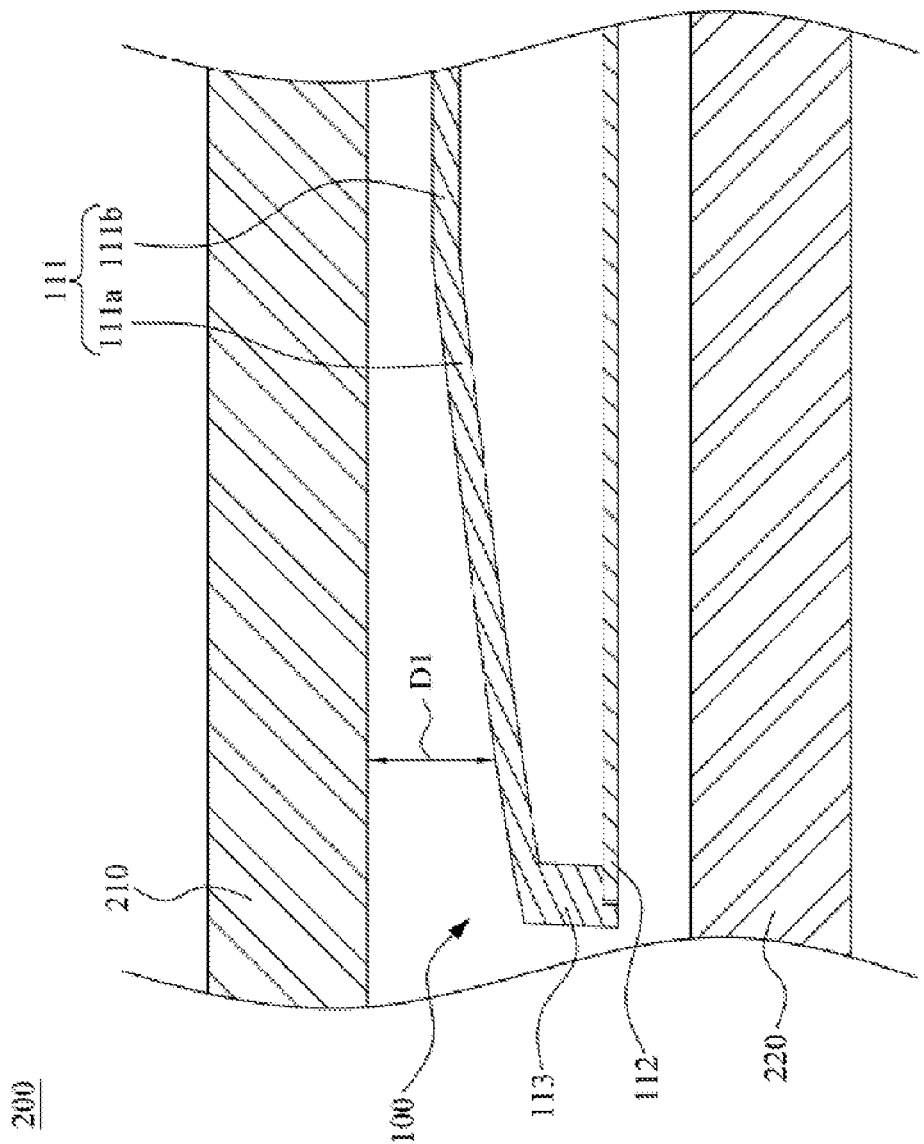
FIG. 3 is a partial longitudinal cross-sectional view of an electronic device according to an embodiment of this disclosure.

Referring to FIG. 3, FIG. 3 is a partial longitudinal cross-sectional view of an electronic device 200 according to an embodiment of this disclosure. As shown in FIG. 3, in this embodiment, the electronic device 200 includes a system upper cover 210, a system lower cover 220, and the fan module 100. The fan module 100 is disposed between the system upper cover 210 and the system lower cover 220. In an embodiment, the electronic device 200 is a notebook computer.

As shown in FIG. 3, in this embodiment, a vertical distance D1 between the first oblique portion 111a of the first cover plate 111 and the system upper cover 210 is smaller when the first oblique portion 111a and the system upper cover 210 are closer to the axis A. Therefore, the fluid impedance, generated by airflow that is entering the housing 110 through an air channel between the first oblique portion 111a of the first cover plate 111 and the system upper cover 210, is effectively reduced.

Further, referring to FIG. 2 and FIG. 3 together, in this embodiment, the blade 122 of the impeller 120 has an edge 122a away from the axis A, and a distance between the axis A and an end of the first plane portion 111b close to the first oblique portion 111a (that is, a position at which the first plane portion 111b is connected to the first oblique portion 111a) is equal to a distance between the edge 122a of the blade 122 and the axis A. Therefore, the electronic device 200 has a good balance for "a size of the blade 122" and "a size of the air channel between the system upper cover 210 and the first cover plate 111 of the fan module 100". In this embodiment, even if the accommodating space of the housing 110 is smaller, the size of the blade 122 also can be keep to maintain performance of the fan module 100. In addition, there is a distance between the first oblique portion 111a and the system upper cover 210 so as to avoid that the first cover plate 111 and the system upper cover 210 are too close to increase the fluid impedance.

In some embodiments, the distance between the axis A and the end of the first plane portion 111b close to the first oblique portion 111a is alternatively greater than the distance between the edge 122a of the blade 122 and the axis A.

Referring to FIG. 1 again, in this embodiment, the fan module 100 further includes two flow guide ribs 130 (only one is exemplarily shown in FIG. 1). The flow guide rib 130 is disposed on a side of the first oblique portion 111a away from the impeller 120 (that is, disposed on an upper surface of the first cover plate 111) and the low guide rib 130 is extending from an end of the first oblique portion 111a away from the axis A to the other end of the first oblique portion 111a close to the axis A (that is, extends from the first outer outline C1 toward the axis A). Therefore, the flow guide rib 130 effectively guides an airflow to flow toward the air inlet 111c of the first cover plate 111. In addition, the flow guide rib 130 further enhances overall structural strength of the first cover plate 111.

Figure 4:
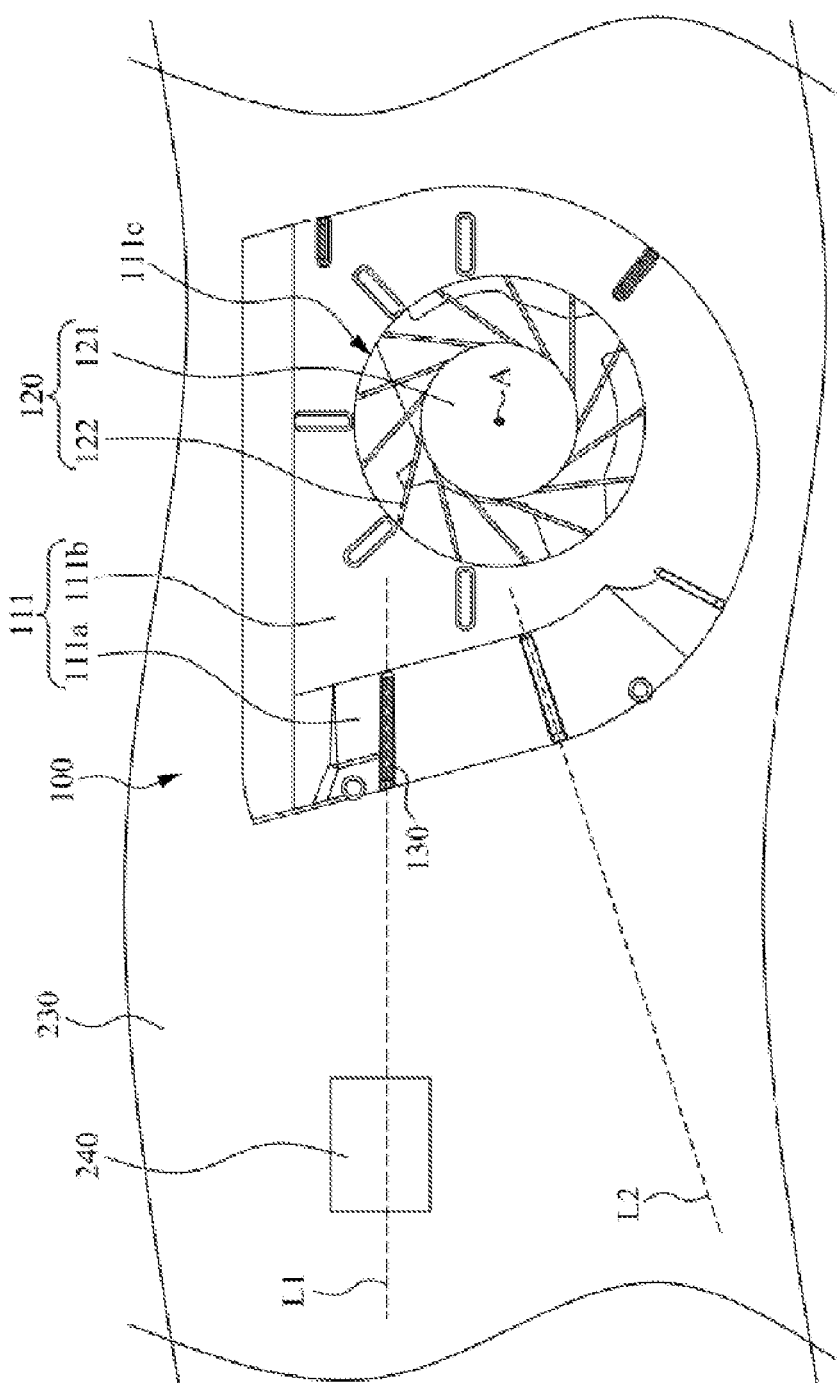
FIG. 4 is a partial top view of some elements of an electronic device according to an embodiment of this disclosure.

FIG. 4 is a partial top view of some elements of an electronic device 200 according to an embodiment of this disclosure. As shown in FIG. 4, in this embodiment, the electronic device 200 further includes a circuit board 230 and a heating source 240 located between the system upper cover 210 and the system lower cover 220. In an embodiment, the circuit board 230 is a mainboard disposed in a notebook computer, and the heating source 240 is a central processing unit disposed on the mainboard. When the electronic device 200 is viewed from the top (as shown in FIG. 4), at least a part of the heating source 240 is located between extension lines L1 and L2 of the two flow guide ribs 130. Therefore, the flow guide rib 130 effectively guides an airflow near the heating source 240 to flow toward the air inlet 111c of the first cover plate 111.

In an actual application, the number of flow guide ribs 130 is not limited by the embodiment shown in FIG. 1 and flexibly increases or decreases according to requirements.

Figure 5:
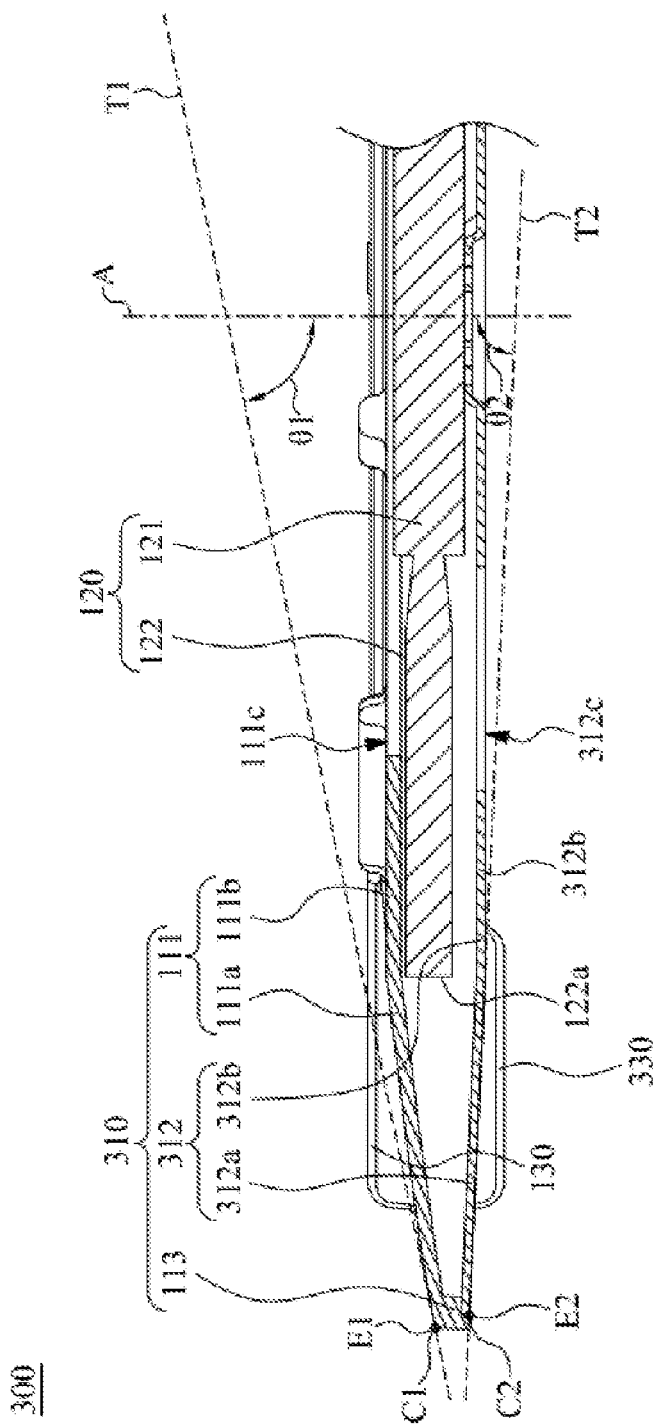
FIG. 5 is a cross-sectional view of a fan module along the line segment 2-2 in FIG. 1 according to another embodiment of this disclosure.

Referring to FIG. 5, FIG. 5 is a cross-sectional view of a fan module 300 along the line segment 2-2 in FIG. 1 according to another embodiment of this disclosure. As shown in FIG. 5, in this embodiment, the fan module 300 includes a housing 310 and an impeller 120, and the housing 310 includes a first cover plate 111, a second cover plate 312, and a side plate 113. Structures and relative positions of the impeller 120 and the first cover plate 111 and the side plate 113 of the fan module 300 are substantially the same as those in the embodiment shown in FIG. 1. Therefore, refer to the foregoing related content, details are not described herein again.

It should be noted that compared with the embodiment shown in FIG. 1, the second cover plate 312 in this embodiment has a second outer outline C2 away from the axis A, a tangent line T2 of an endpoint E2 on the second outer outline C2 intersects with the axis A to form an angle θ2, and the angle θ2 is not a right angle. The side plate 113 is located between the first outer outline C1 and the second outer outline C2 and is connected to the first outer outline C1 and the second outer outline C2. By means of the structural configuration, compared with the embodiment shown in FIG. 1, the fan module 300 in this embodiment also effectively reduces the fluid impedance generated by that an airflow located near the side plate 113 moves to a lower surface of the second cover plate 312 and enters the housing 310 through an air inlet 312c of the second cover plate 312.

Therefore, the flow rate of the airflow generated by the fan module 300 in this embodiment is further increased at a side of the housing 310.

As shown in FIG. 5, in this embodiment, the angle θ2 is not equal to the angle θ1. However, in other embodiments, the angle θ2 is equal to the angle θ1. This is flexibly adjusted according to actual requirements.

As shown in FIG. 5, in this embodiment, the second cover plate 312 has a second oblique portion 312a and a second plane portion 312b. The second oblique portion 312a obliquely extends to the second outer outline C2 relative to the axis A. The second plane portion 312b is located at an end of the second oblique portion 312a close to the axis A.

As shown in FIG. 5, in this embodiment, the second oblique portion 312a includes a planar area, and the planar area is oblique toward a direction away from the impeller 120. In other embodiments, the second oblique portion 312a includes a curved area.

As shown in FIG. 5, in this embodiment, the second plane portion 312b substantially extends along a direction perpendicular to the axis A.

As shown in FIG. 5, in this embodiment, the second oblique portion 312a is connected to the second plane portion 312b. In other embodiments, the second cover plate 312 further has at least one relay portion connected between the second oblique portion 312a and the second plane portion 312b.

Figure 6:
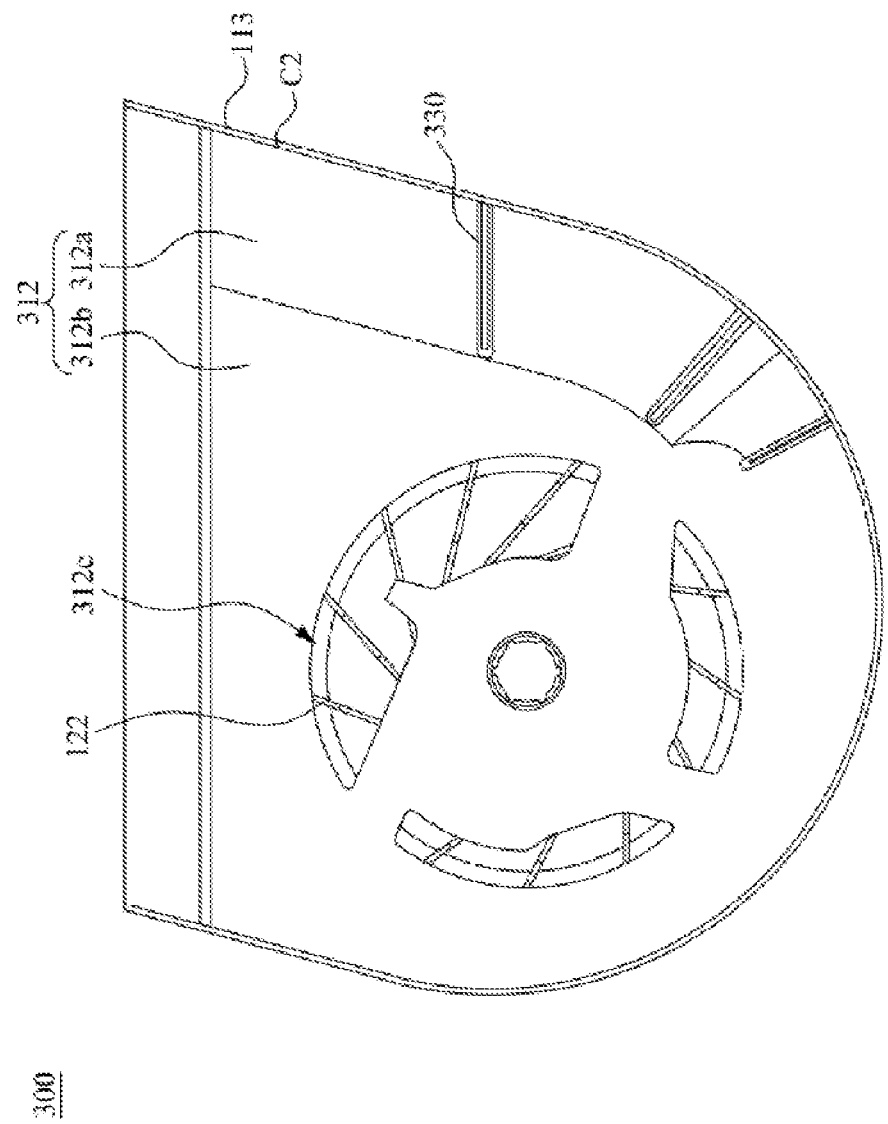
FIG. 6 is a bottom view of the fan module in FIG. 5.

Referring to FIG. 6, FIG. 6 is a bottom view of the fan module in FIG. 5. As shown in FIG. 5 and FIG. 6, in this embodiment, the fan module 300 further includes two flow guide ribs 330 (only one is exemplarily shown in FIG. 6). The flow guide rib 330 is disposed on a side of the second oblique portion 312a away from the impeller 120 (that is, disposed on a lower surface of the second cover plate 312) and extending from an end of the second oblique portion 312a away from the axis A to the other end of the second oblique portion 312a close to the axis A (that is, extends from the second outer outline C2 toward the axis A). By means of the structural configuration, the flow guide rib 330 effectively guides airflow to flow toward the air inlet 312c of the second cover plate 312. In addition, the flow guide rib 330 further enhances overall structural strength of the second cover plate 312.

Referring to FIG. 4 and FIG. 6 together, in these embodiments, the flow guide rib 130 disposed on the first cover plate 111 is not set corresponding to the flow guide rib 330 on the second cover plate 312. In some other embodiments, the flow guide rib 130 on the first cover plate 111 is set corresponding to the flow guide rib 330 on the second cover plate 312. This is adaptively adjusted according to an actual requirement (in an embodiment, a position of a heat source or an electronic element thereof in the electronic device).

Figure 7:
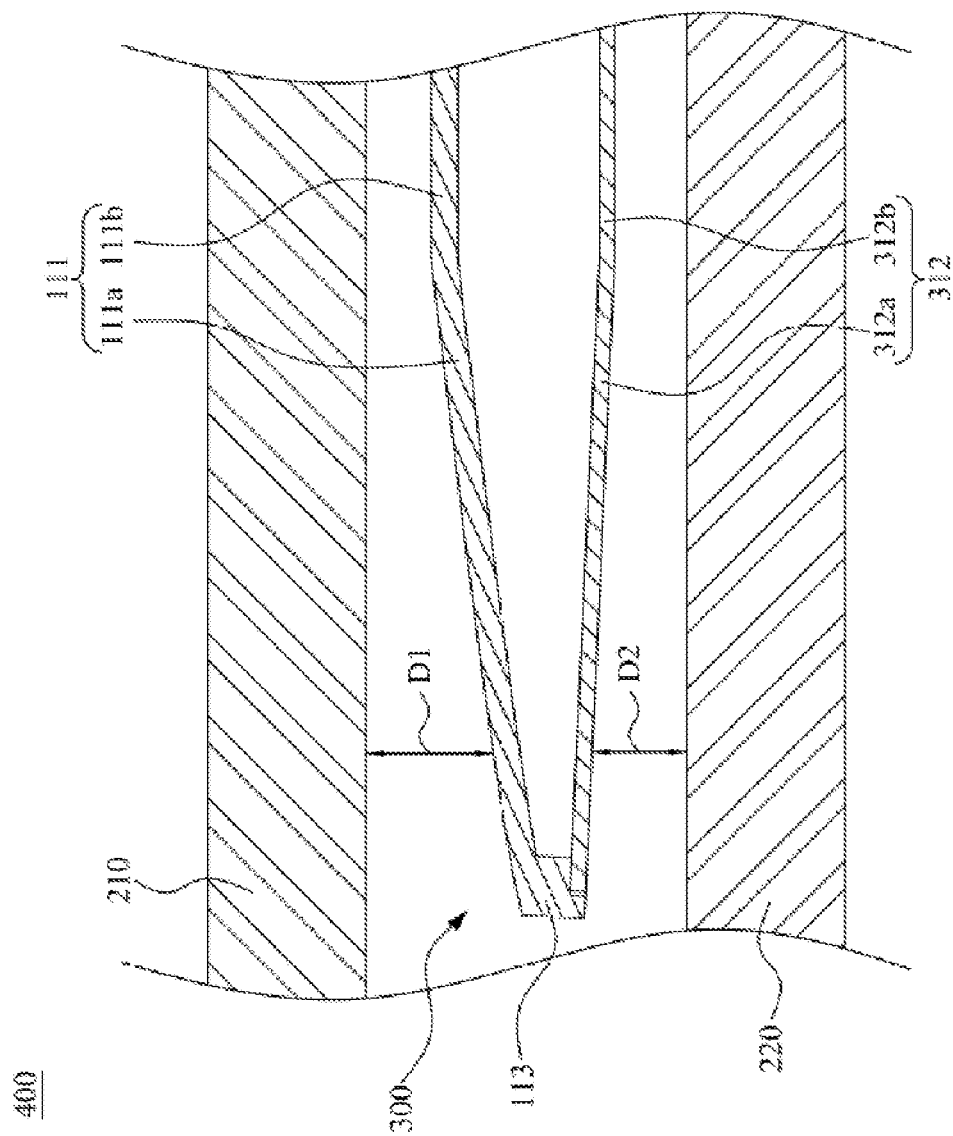
FIG. 7 is a partial longitudinal cross-sectional view of an electronic device according to another embodiment of this disclosure.

Referring to FIG. 7, FIG. 7 is a partial longitudinal cross-sectional view of an electronic device according to another embodiment of this disclosure. As shown in FIG. 7, in this embodiment, the electronic device 400 includes a system upper cover 210, a system lower cover 220, and the fan module 300. In this embodiment, a vertical distance D2 between the second oblique portion 312a of the second cover plate 312 and the system lower cover 220 is smaller when the second oblique portion 312a and the system lower cover 220 are closer to the axis A. By means of the structural configuration, the fluid impedance of an airflow entering the housing 310 through an air channel between the second oblique portion 312a of the second cover plate 312 and the system lower cover 220 is effectively reduced.

Referring to FIG. 5 and FIG. 7, in this embodiment, a distance between the axis A and an end of the second plane portion 312b close to the second oblique portion 312a (that is, a position at which the second plane portion 312b is connected to the second oblique portion 312a) is equal to a distance between the edge 122a of the blade 122 and the axis A. By means of the structural configuration, the electronic device 400 in this embodiment obtains a good balance for "a size of the blade 122" and "a size of the air channel between the system lower cover 220 and the second cover plate 312 of the fan module 300". In this embodiment, even if the accommodating space of the housing 310 is smaller, the size of the blade 122 also can be keep to maintain performance of the fan module 300. In addition, there is a distance between the second oblique portion 312a and the system lower cover 220 so as to avoid that the second cover plate 312 and the system upper cover 210 are too close to increase the fluid impedance. In some embodiments, the distance between the axis A and the end of the second plane portion 312b close to the second oblique portion 312a is greater than the distance between the edge 122a of the blade 122 and the axis A.

In summary, the disclosure provides the fan module can effectively reduce the fluid impedance generated by that an airflow located near the endpoint moves to an upper surface of the cover plate because the tangent line of the endpoint of the outer outline of the cover plate intersects with the axis to form an angle, and the angle is not a right angle. In addition, the electronic device of this disclosure effectively reduces the fluid impedance generated by that an airflow enters the housing through the air channel between the oblique portion of the cover plate and the system upper cover because the vertical distance between the oblique portion of the cover plate and the system upper cover is smaller when the oblique portion and the system upper cover are closer to the axis.

Although this disclosure is disclosed as above by using embodiments, the embodiments are not intended to limit this disclosure. A person skilled in the art makes various variations and improvements without departing from the spirit and scope of this disclosure. Therefore, the protection scope of this disclosure should be subject to the appended claims.

What is claimed is:

1. A fan module, comprising:
a housing, comprising a first cover plate, wherein the first cover plate has at least one first oblique portion;
an impeller, disposed in the housing and configured to rotate around an axis, wherein the first cover plate has a first outer outline away from the axis, a tangent line of an endpoint on the first outer outline intersects with the axis to form an angle, the angle is not a right angle, and the at least one first oblique portion obliquely extends to the first outer outline relative to the axis; and
a plurality of flow guide ribs, located external to the housing, wherein opposite ends of each of the flow guide ribs are respectively located at an end of the at least one first oblique portion away from the axis and an end of the at least one first oblique portion close to the axis.

2. The fan module according to claim 1, wherein the at least one first oblique portion comprises a curved area or a planar area.

3. The fan module according to claim 1, wherein the first cover plate further has a first plane portion, and the first plane portion is located at an end of the at least one first oblique portion close to the axis.

4. The fan module according to claim 3, wherein the impeller comprises at least one blade, the at least one blade has an edge away from the axis, and a distance between the axis and an end of the first plane portion close to the at least one first oblique portion is equal to or greater than a distance between the edge of the at least one blade and the axis.

5. The fan module according to claim 1, wherein the plurality of flow guide ribs is disposed on the at least one first oblique portion and extending from the first outer outline toward the axis.

6. The fan module according to claim 1, wherein the housing further comprises a second cover plate, the second cover plate and the first cover plate are respectively disposed on two opposite sides of the impeller, the second cover plate has a second outer outline away from the axis, a tangent line of an endpoint on the second outer outline intersects with the axis to form an angle, and the angle is not a right angle.

7. The fan module according to claim 6, wherein the second cover plate has at least one second oblique portion, and the at least one second oblique portion obliquely extends to the second outer outline relative to the axis.

8. An electronic device, comprising:
a system upper cover;
a system lower cover; and
a fan module, disposed between the system upper cover and the system lower cover and comprising:
a housing, comprising a first cover plate, wherein the first cover plate has a first oblique portion;
an impeller, disposed in the housing and configured to rotate around an axis, wherein the first cover plate has a first outer outline away from the axis, a tangent line of an endpoint on the first outer outline intersects with the axis to form an angle, the angle is not a right angle, and the first oblique portion obliquely extends to the first outer outline relative to the axis; and
two flow guide ribs, located external to the housing, wherein opposite ends of each of the two flow guide ribs are respectively located at an end of the first oblique portion away from the axis and an end of the first oblique portion close to the axis.

9. The electronic device according to claim 8, wherein a vertical distance between the first oblique portion and the system upper cover is smaller when the first oblique portion and the system upper cover are closer to the axis.

10. The electronic device according to claim 9, further comprising a heating source located between the system upper cover and the system lower cover, wherein the two flow guide ribs are disposed on the first oblique portion and extending from the first outer outline toward the axis, and at least a part of the heating source is located between extension lines of the two flow guide ribs.

11. The electronic device according to claim 8, wherein the housing further comprises:
a second cover plate, wherein the second cover plate and the first cover plate are respectively disposed on two opposite sides of the impeller,
wherein the second cover plate has a second outer outline away from the axis, a tangent line of an endpoint on the second outer outline intersects with the axis to form an angle, and the angle is not a right angle.

12. The electronic device according to claim 11, wherein the second cover plate has a second oblique portion, the second oblique portion obliquely extends to the second outer outline relative to the axis, and a vertical distance between the second oblique portion and the system lower cover is smaller when the second oblique portion and the system lower cover are closer to the axis.

13. A fan module, comprising:
a housing, comprising a cover plate, wherein the cover plate has at least one oblique portion and a plane portion;
an impeller, disposed in the housing and configured to rotate around an axis, wherein the cover plate has a outer outline away from the axis, a tangent line of an endpoint on the outer outline intersects with the axis to form an angle, the angle is not a right angle, the at least one oblique portion obliquely extends to the outer outline relative to the axis, and the plane portion is located at an end of the at least one oblique portion close to the axis;
a plurality of flow guide ribs, located external to the housing, disposed on the at least one oblique portion and extending from the outer outline toward the axis; and
a plurality of second flow guide ribs, located external to the housing, disposed on the plane portion and spaced apart from the at least one oblique portion.

\* \* \* \* \*